United States Patent
Houle et al.

(10) Patent No.: US 7,195,951 B2
(45) Date of Patent: Mar. 27, 2007

(54) CARBON-CARBON AND/OR METAL-CARBON FIBER COMPOSITE HEAT SPREADERS

(75) Inventors: Sabina J. Houle, Phoenix, AZ (US); Paul A. Koning, Chandler, AZ (US); Greg M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/991,621

(22) Filed: Nov. 17, 2004

(65) Prior Publication Data

US 2005/0104197 A1   May 19, 2005

Related U.S. Application Data

(62) Division of application No. 09/955,889, filed on Sep. 18, 2001, now Pat. No. 6,837,306, which is a division of application No. 09/670,923, filed on Sep. 29, 2000, now Pat. No. 6,469,381.

(51) Int. Cl.
*H01L 21/00* (2006.01)

(52) U.S. Cl. .................. 438/106; 438/65; 438/51; 257/E21.499

(58) Field of Classification Search .......... 438/106, 438/122
See application file for complete search history.

(56) References Cited

U.S. PATENT DOCUMENTS

| | | | |
|---|---|---|---|
| 4,257,835 A | 3/1981 | Bompard | |
| 5,523,260 A | 6/1996 | Missle | |
| 5,591,034 A | 1/1997 | Ameen et al. | |
| 5,660,917 A | 8/1997 | Fujimori et al. | |
| 5,767,023 A | 6/1998 | Berger et al. | |
| 5,834,337 A * | 11/1998 | Unger et al. | 438/122 |
| 5,849,130 A * | 12/1998 | Browne | 156/256 |
| 6,048,919 A * | 4/2000 | McCullough | 524/404 |
| 6,060,166 A * | 5/2000 | Hoover et al. | 428/408 |
| 6,102,681 A * | 8/2000 | Turner | 418/48 |
| 6,331,451 B1 * | 12/2001 | Fusaro et al. | 438/126 |
| 6,451,418 B1 * | 9/2002 | Tobita | 428/297.4 |
| 6,485,136 B1 * | 11/2002 | Shimizu et al. | 347/86 |
| 2002/0092634 A1 * | 7/2002 | Rokman et al. | 162/156 |
| 2002/0123289 A1 * | 9/2002 | DeAngelis et al. | 442/377 |

FOREIGN PATENT DOCUMENTS

| | | |
|---|---|---|
| EP | 0 066 400 A1 | 12/1982 |
| FR | 2 704 479 A | 11/1994 |
| JP | 06-268114 A * | 9/1994 |
| WO | WO 00/44212 A | 7/2000 |

OTHER PUBLICATIONS

Notification of Transmittal of the International Search Report and International Search Report for Application No. PCT/US 01/30352 filed Sep. 29, 2001 having a mailing date of Apr. 29, 2002.

* cited by examiner

*Primary Examiner*—Scott B. Geyer
*Assistant Examiner*—Elias Ullah
(74) *Attorney, Agent, or Firm*—Blakely, Sokoloff, Taylor & Zafman LLP (57) ABSTRACT

A heat spreader, comprised of a plurality of carbon fibers oriented in a plurality of directions, with a carbon or metal matrix material dispersed about the fibers, is described. The carbon fibers facilitate the spreading of heat away from the smaller semiconductor device and up to a larger heat removal device, such as a heat sink.

6 Claims, 9 Drawing Sheets

CARBON-CARBON AND/OR METAL-CARBON FIBER COMPOSITE HEAT SPREADERS

The present patent application is a divisional of application No. 09/955,889 filed Sep. 18, 2001 now U.S. Pat. No. 6,837,306, which is a divisional of application No. 09/670,923 filed Sep. 29, 2000 which is issued as U.S Pat. No. 6,469,381.

BACKGROUND

1. Field of the Invention

This invention relates to semiconductor manufacturing technology generally, and more specifically, to heat spreader technology for heat dissipation in a semiconductor package.

2. Description of the Related Art

There is a trend toward increasing the number of functions built into a given integrated circuit (also referred to herein as a device). This results in an increasing density of circuits in the device. Along with the increased circuit density, there is always a desire to increase the data processing rate; therefore, the clock speed of the device is increased as well. As the density of circuits and the clock speed increase, the amount of heat generated by the device increases. Unfortunately, device reliability and performance will decrease as the amount of heat that the device is exposed to increases. Therefore, it is critical that there be an efficient heat-removal system associated with integrated circuits.

Figure 1:
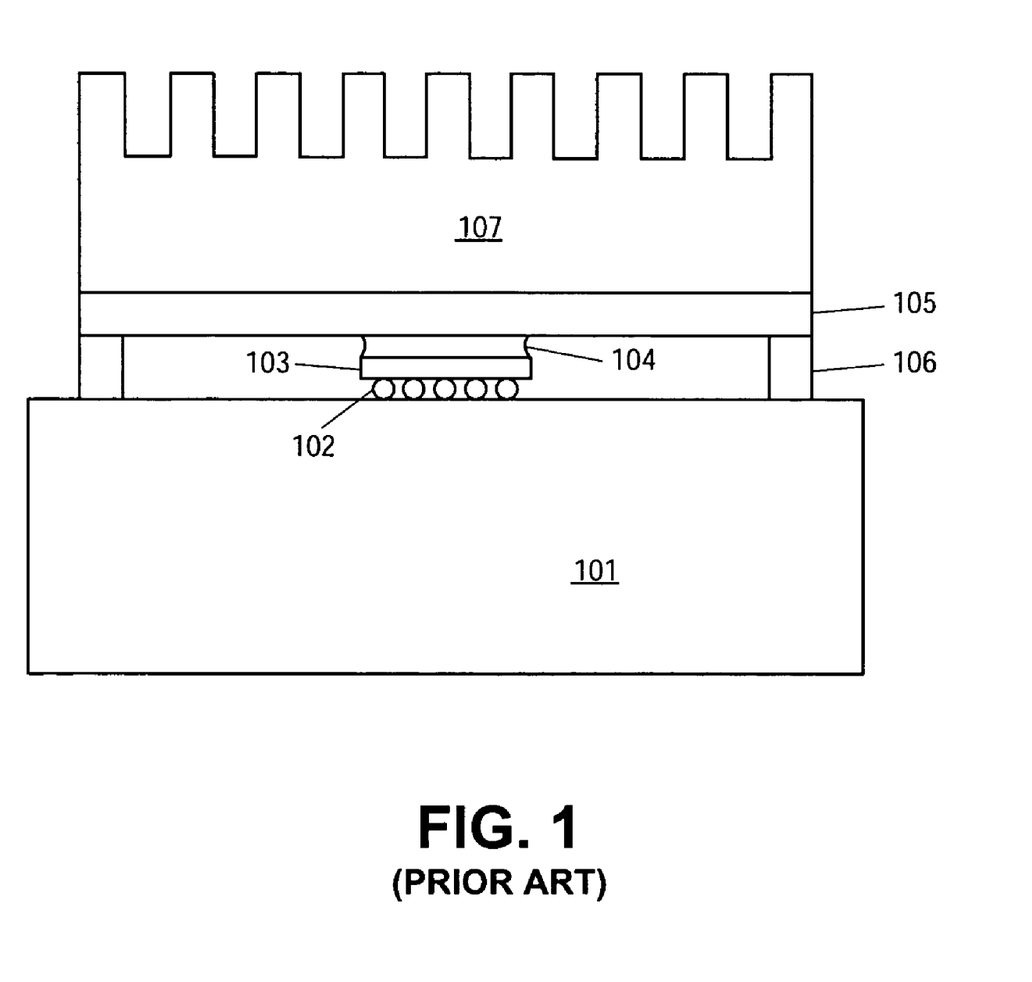
FIG. 1 shows a prior art integrated circuit package design.

FIG. 1 illustrates a typical integrated circuit and associated packaging. There are a number of methods for removing heat from integrated circuits 103, including active methods, such as fans or recirculated coolants (not shown), or passive methods, such as heat sinks 107 and heat spreaders 105. Because of the decreasing device 103 size, there is usually a need to evenly distribute heat generated by the small device 103 to the larger heat sink 107 to eliminate "hot spots" in the device. This is the function of heat spreaders 105. Heat spreaders are coupled to the integrated circuit 103 through the use of a thermally conductive material 104. These thermal interface materials 104, such as gel or grease containing metal particles to improve heat conduction, are applied in between the device 103 and the heat spreading structure 105 to improve the heat transfer from the integrated circuit 103 to the heat spreader 105. Typically, the heat spreading structure 105 will be constructed either of a ceramic material or a metal, such as aluminum or copper. Aluminum is preferred from a cost standpoint, as it is easy and cheap to manufacture; however, as the heat load that needs to be transferred increases, copper becomes the metal of choice because of its superior heat transfer characteristics (the thermal conductivity for Al is ~250 W/m·K vs ~395 W/M·K for Cu.) There will typically be a contiguous wall 106 around the periphery of the heat spreader, which serves as a point of attachment and support between the substrate 101 and the spreader 105. There is often a heat sink 107 attached to the heat spreader 105, to allow for the greater cooling capacity associated with the high-surface area of the heat sink 107.

With increased heat dissipation requirements, it has become necessary to improve heat spreader 105 and/or heat sink 107 performance. While improving heat sink performance through active cooling methods such as fans or recirculated liquids works well, there are a number of disadvantages associated with this solution, including bulkiness, cost and noise.

Figure 2A:
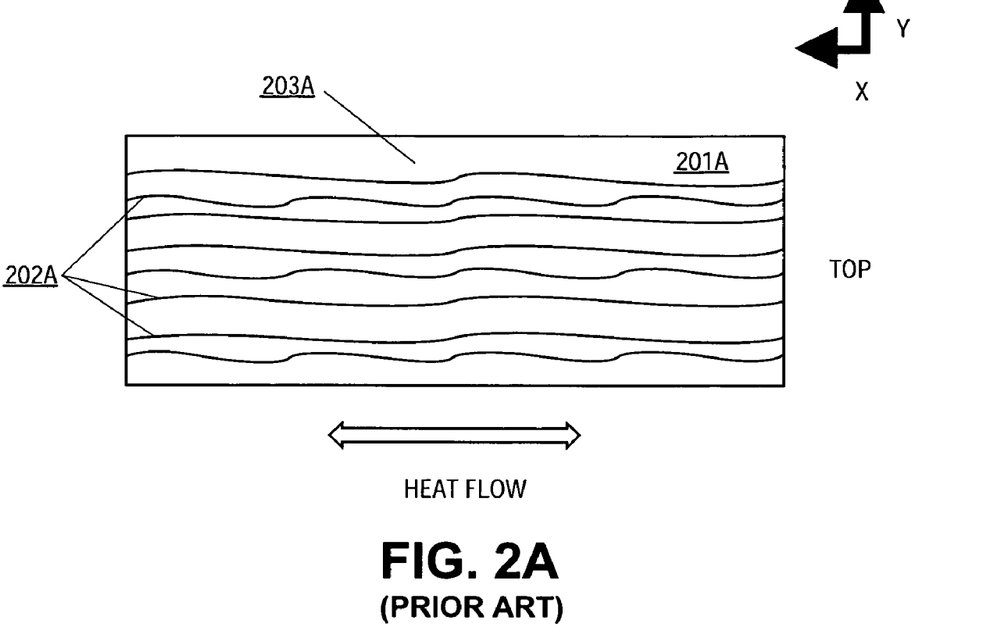
FIG. 2a shows a prior art heat spreader design.
Figure 2B:
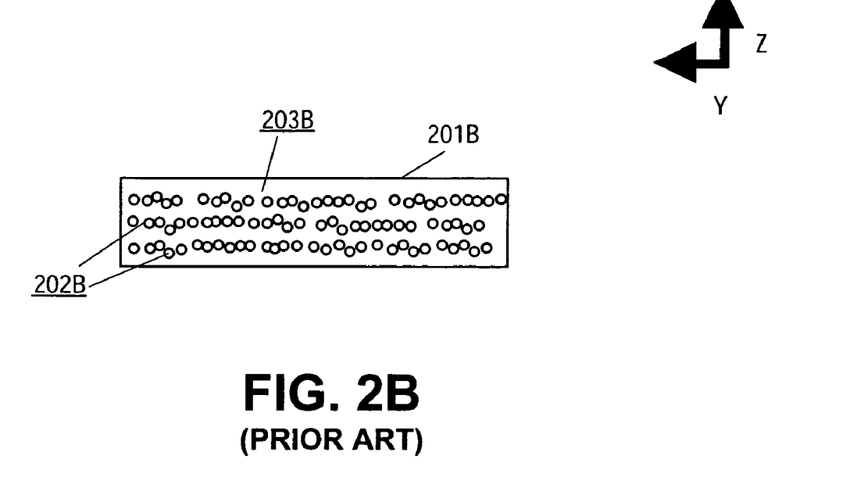
FIG. 2b shows a cross-section of a prior art heat spreader design.

A second method for increasing heat dissipation capacity for integrated circuit packaging is through improvement of heat spreader performance. Current heat spreader materials allow for heat conduction in the range of 80–400 W/m-° K. FIG. 2 illustrates one method of increasing the rate of heat conduction in heat spreaders 201a, 201b. FIG. 2a shows a top view of a heat spreader 201a while FIG. 2b illustrates a cross-section of the same heat spreader 201b. Composites using layers of highly conductive carbon fibers 202a, 202b impregnated with carbon resin or metals 203a, 203b are known to be very effective conductors of heat. These materials also offer the added advantage of lighter weight as compared to the present materials (e.g. a density of 5.9 g/cc for Cu matrix composite versus 8.9 g/cc for copper), decreasing packaging weight, shipping cost and offering ergonomic advantages for manufacturing personnel. However, these materials have suffered from the disadvantage of being anisotropicaily oriented in their heat flow, thus they are typically highly conductive (>500 W/m-° K.) in only one direction. The direction of heat conduction follows the longitudinal orientation of carbon fibers, therefore the unidirectional heat flow is a result of the majority of the fibers in the composite being oriented in one direction. The aforementioned advantages are often outweighed by the disadvantage of poor heat conduction in both the second horizontal and the vertical directions.

Therefore, what is needed is an apparatus for increasing the rate of heat transfer in all three directions, allowing the rapid dissipation of heat through the heat spreader and to the heat sink.

BRIEF DESCRIPTION OF THE DRAWINGS

The present invention is illustrated by way of example, and not limitation, in the Figures of the accompanying drawings in which:

FIG. 8b shows top and side views of differing embodiments of standoffs that can be used on the heat spreader of FIG. 8a.

DETAILED DESCRIPTION

An apparatus for increasing the rate of heat flow through a heat spreader is described. In the following description, numerous specific details are set forth such as material types, dimensions, etc., in order to provide a thorough understanding of the present invention. However, it will be obvious to one of skill in the art that the invention may be practiced without these specific details. In other instances, well-known elements and processing techniques have not been shown in particular detail in order to avoid unnecessarily obscuring the present invention.

A heat spreader, comprised of a plurality of carbon fibers oriented in a plurality of directions, with a carbon or metal matrix material dispersed about the fibers, is described. The carbon fibers facilitate the spreading of heat away from the smaller semiconductor device and up to a larger heat removal device, such as a heat sink.

This discussion will mainly be limited to those needs associated with removing heat from the backside of a flip chip that is housed within a SMT or INT package. It will be recognized, however, that such focus is for descriptive purposes only and that the apparatus and methods of the present invention are applicable to other types of electronic devices and other types of packaging.

Figure 3:
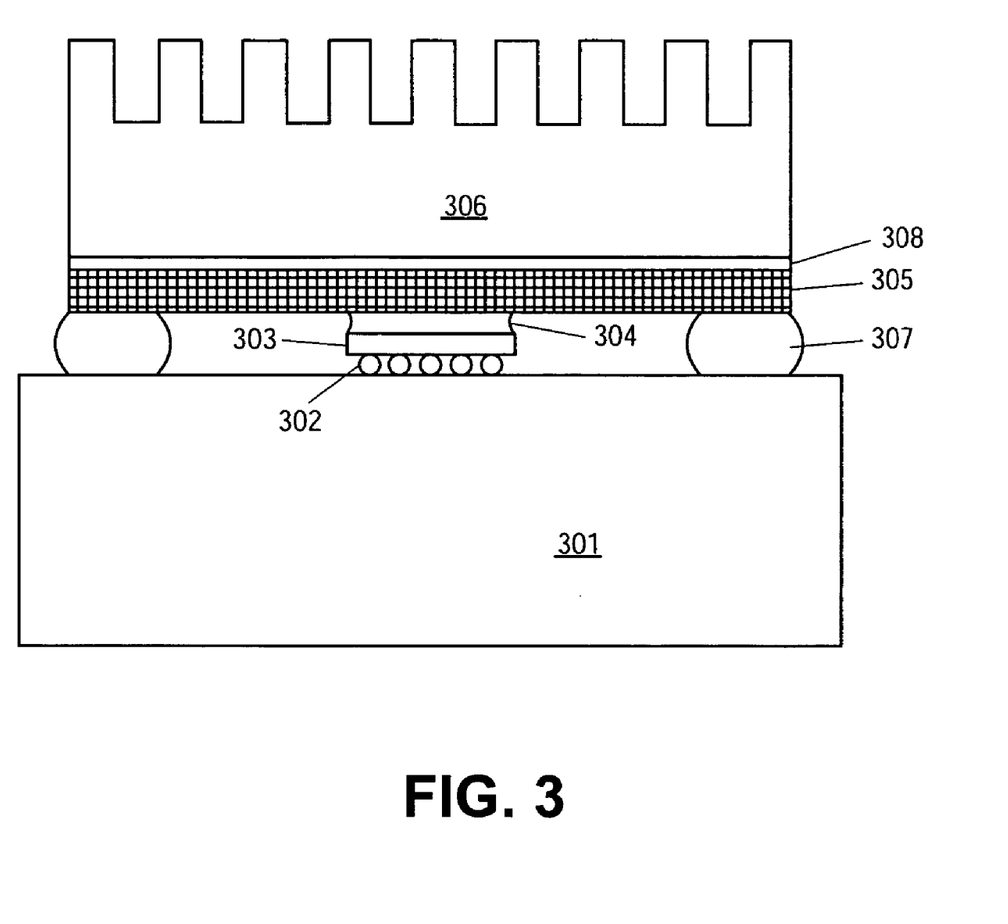
FIG. 3 shows a cross section of an integrated circuit package containing an embodiment of a heat spreader using carbon fibers to spread heat in multiple dimensions.

FIG. 3 illustrates a cross-section view of a semiconductor package in one embodiment of the present invention. The package includes a substrate 301 having a semiconductor device 303 mounted on a top surface of the substrate 301. In one embodiment the substrate 301 is a printed circuit board. In another embodiment, the substrate 301 may be a different material, such as silicon or ceramic.

In one embodiment, the semiconductor device 303 is mechanically and electrically coupled to the top surface of the substrate via a plurality of solder bump connections 302. In an embodiment the gap may be filled with an epoxy underfill material (not shown). The substrate 301 contains at least one wiring layer (not shown) that electrically connects the device to pins or balls located along the bottom surface of the substrate 301.

In accordance with the present invention, a composite heat spreader 305 is thermally coupled to the bottom of the flip chip structure 302, 303 through a compliant heat-transfer medium 304. In one embodiment, the heat transfer medium is thermal grease. In another embodiment, gel or other proprietary formulations may be used.

The heat spreader is further attached to the substrate using a sealant material 307. The sealant material 307 surrounds the device 303 and fills the gap between the substrate 301 and the heat spreader 305, forming a completely enclosed cavity containing the device 303. The use of the sealant material 307 allows for a more flexible bond between the substrate 301 and the heat spreader 305. In one embodiment the sealant material may be silicone or other proprietary sealant material. The flexible bond may help to compensate for differing coefficients of thermal expansion (CTE) between the heat spreader and the substrate, resulting in a more consistent heat conduction pathway. A second advantage of the current embodiment is that the sealant is much lighter in weight compared to the metal used in the prior art contiguous wall (See FIG. 1, 106) design, resulting in a lighter package.

Next, a heat sink 306 is attached to the heat spreader 305 using a thermal interface material 308. In one embodiment, the thermal interface material 308 is thermal grease. The heat sink 306 should allow for the more rapid dissipation of heat due to increased surface area for cooling, as discussed in the Background section above.

Figure 4A:
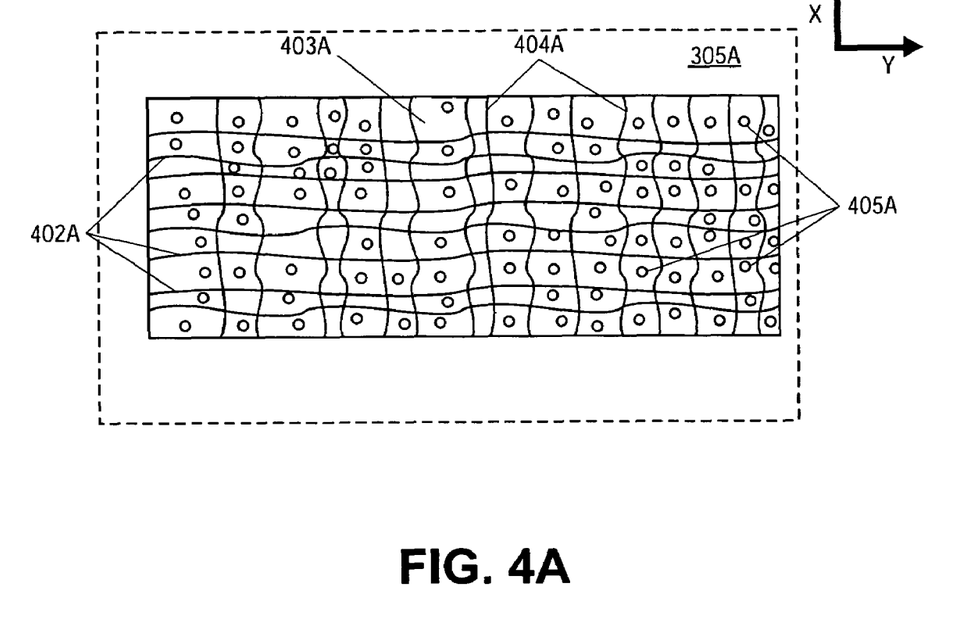
FIG. 4a shows a top view of an embodiment of a heat spreader using carbon fibers to spread heat in multiple dimensions
Figure 4B:
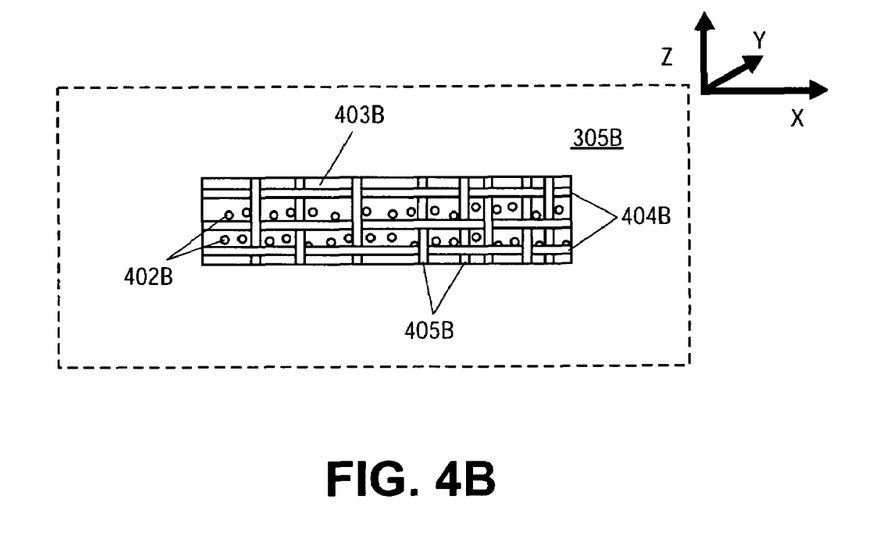
FIG. 4b shows a crosssection of an embodiment of a heat spreader using carbon fibers to spread heat in multiple dimensions

FIGS. 4a (top view) and 4b (cross-sectional view) further illustrate the heat spreader of FIG. 3. The heat spreader 305a; 305b is formed from a composite material comprised either of carbon fibers 402a, 404a, 405a, 402b, 404b, 405b impregnated with a resin material 403a, 403b (referred to as a carbon/carbon composite) or carbon fibers 402a, 404a, 405a, 402b, 404b, 405b impregnated with a metal or metal alloy 403a, 403b (referred to as a metal/carbon composite). In one embodiment of the present invention, a carbon/copper composite material is used. However, in another embodiment, the composite may use a different thermally conductive matrix metal, such as aluminum or magnesium, a metal alloy, a ceramic, such as silicon carbide, or an organic material, such as resin.

One factor in the choice of what composite material to use may be what material had been used previously in the packaging process. Matching the metal/composite material with the previous heat spreader material may allow the use of the same adhesive or thermal grease system as previously used, thus simplifying the conversion process from one heat spreader material to another. A second factor to consider in choosing the type of composite material to use is the CTE of the substrate material. It may be possible to better match the CTE of the heat spreader with that of the substrate, allowing for the production of a more reliable package.

In the present embodiment, the heat spreader contains horizontal layers of fiber bundles 402a, 404a and 402a, 404b, consisting of two perpendicular sets of fiber bundles woven into a sheet, oriented in the x-y plane of the apparatus. These woven fiber bundles facilitate heat conduction in the x-y plane. In addition, there is a second set of fiber bundles 405a, 405b, oriented substantially perpendicular to the first set. The substantially perpendicular fiber bundles facilitate the conduction of heat in the z-direction.

In the present embodiment, the fiber bundles are comprised of approximately 1000 individual carbon fibers twisted into a fiber bundle. These bundles of fibers are then woven into a sheet. The weave in the present invention should be balanced, to produce a flatter heat spreader. The weave may be balanced by attempting to ensure that the fibers throughout the x-y plane of the woven mat have substantially the same number of downward stitches as up. In one embodiment, the individual carbon fibers have a diameter of approximately 10 microns, with a density of about 2.2 g/cc. In this embodiment, the fibers may have a thermal conductivity as high as 1000 W/m·K. One example of commercially available carbon fiber is Amoco K1100 2K™. While carbon fibers are discussed in this embodiment, other types of highly conductive (>500 W/m·K) fibers or wires, based on materials such as polymers, metals or ceramics, may work in the present invention. In a different embodiment, the fibers may have very different physical and dimensional properties, and the above thermal and physical properties should not be construed as limiting the properties of the fibrous materials used.

The woven fiber sheets are then impregnated with a metal, metal alloy, carbon or ceramic matrix material, as discussed above. The matrix material may be dispersed about the woven sheets using a number of different methods. In this embodiment, a compression molding method is used. In another embodiment, injection molding or any of a multitude of molding processes practiced in the art may be used. The molded material may be allowed to cure, and then, if necessary, could be cut to the correct dimensions. In an embodiment, a laser may be used to cut the composite material. In another embodiment, a mechanical means, such as a saw or mill, may be used.

The heat spreader in the current invention provides for better conduction of heat in the z direction, with a possible thermal conductivity in the range of 500–1000 W/m·K. In the present embodiment, a finned heat sink can be attached to the top surface of the heat spreader. Through the use fibers oriented in the z-direction, heat can be conducted up through the heat spreader to the heat sink, and the heat can be dissipated to the surrounding environment, with cooling for the sink provided by the surrounding air or an active cooling method, as discussed in the Background section.

In addition, the fibers oriented in the x-y plane 402a, 402b, 403a, and 403b allow the heat to dissipate radially, thus preventing the formation of localized hot spots. Localized heating decreases the area available for heat transfer, which decreases the overall heat flux from the device. The fibers in the x-y plane 402a, 402b, 403a, and 403b allow the conducted heat to rapidly dissipate from the relatively small contact area in the point of attachment of the device to the heat spreader, over virtually the entire (larger) area of the heat spreader. This means that heat can be removed much more efficiently.

Figure 5:
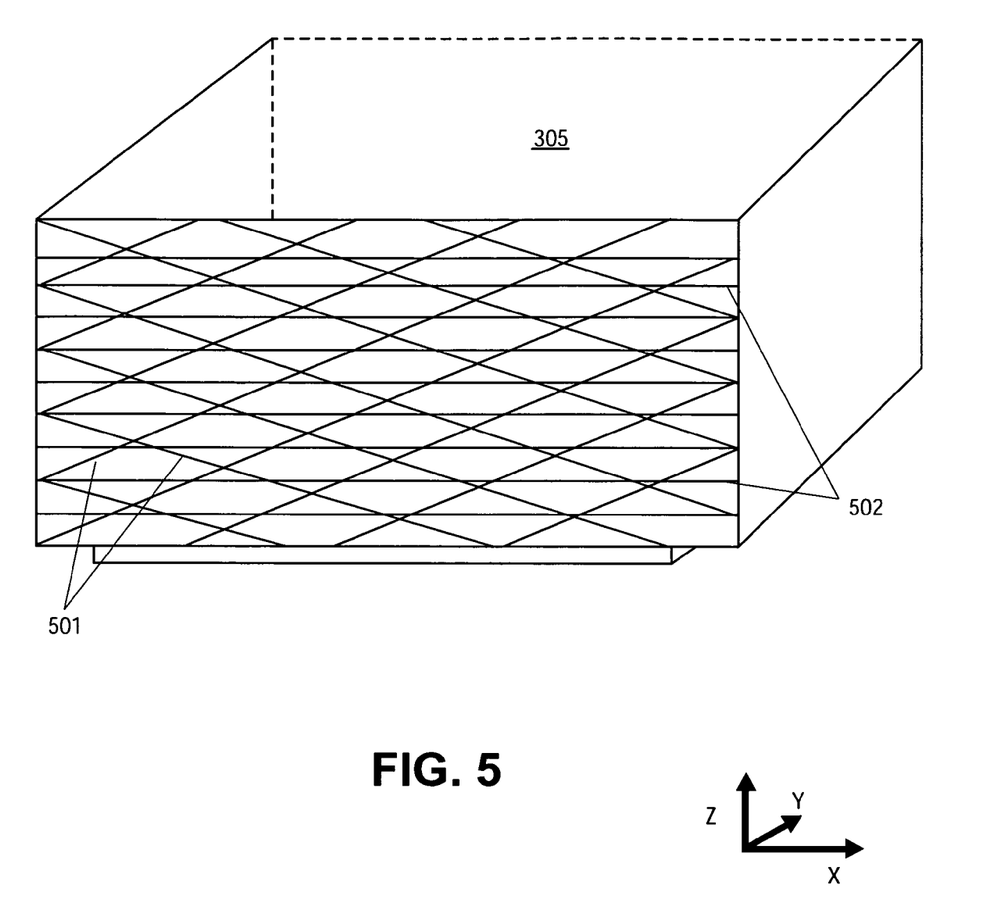
FIG. 5 shows a different embodiment of a heat spreader using carbon fibers to spread heat in multiple dimensions.

FIG. 5 illustrates that the orientation of the fibers in the z-direction may differ from the essentially perpendicular orientation above. In this embodiment, the fibers in the z-axis 502 may be oriented at approximately +/−30 degrees from fibers in the x-y plane 503. It is to be understood, however, that the relative orientation in the z-direction may comprise any angle between 0 and +/−90 degrees from the x-y plane.

Figure 6:
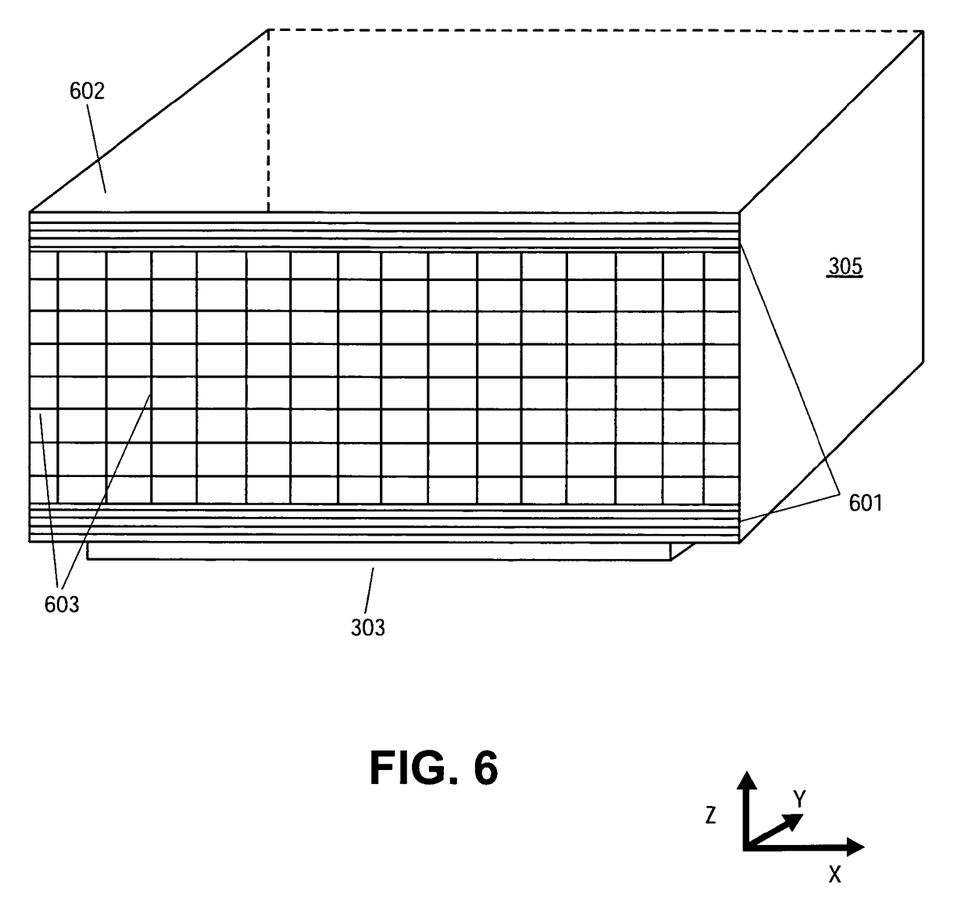
FIG. 6 shows an embodiment of a heat spreader using carbon fibers to spread heat in multiple dimensions where there are thermal interface layers on the top and bottom of the heat spreader to modify heat dissipation efficiency.

In a third embodiment of the invention, it may be desirable to include a higher density thermal interface layer on the top and bottom surface of the heat spreader, as shown in FIG. 6. In this embodiment, the thermal interface layer 601 could comprise the same carbon fiber material used in the above invention 603, only with an increased fiber density from that used in the main body of the heat spreader 603. In an embodiment, the fiber density in the thermal interface layer 601 may be four times that of the main body 603. While this embodiment may use the same fiber as the above embodiments, it is understood that other thermally conductive materials may also be used as the thermal interface material, including non-composite materials. In addition, the higher-density carbon fiber layer may be comprised of chopped fibers, as discussed in FIG. 7 below. In an embodiment, the increased fiber density 601 may allow for even greater heat conduction capability, and may be used to more rapidly dissipate heat in the x-y direction from hot spots in the device 303/heat spreader 305 interface region, in addition to allowing more rapid conduction from the heat spreader 303 to the heat sink (not shown) through the top layer 602.

In another embodiment of the present invention, the fibers predominantly oriented in the z-direction are replaced with chopped fibers. In an embodiment, the chopped fibers are comprised of carbon fiber that has been broken or cut, using a mechanical means, into segments less than 0.5 mm long. However, the length of the chopped fiber may vary considerably from this length, and the aforementioned dimensions should not be construed as limiting the allowable chopped fiber length. In addition, another embodiment may use some other type of highly conductive fibrous material, rather than carbon fiber, as discussed above in FIG. 4.

Figure 7:
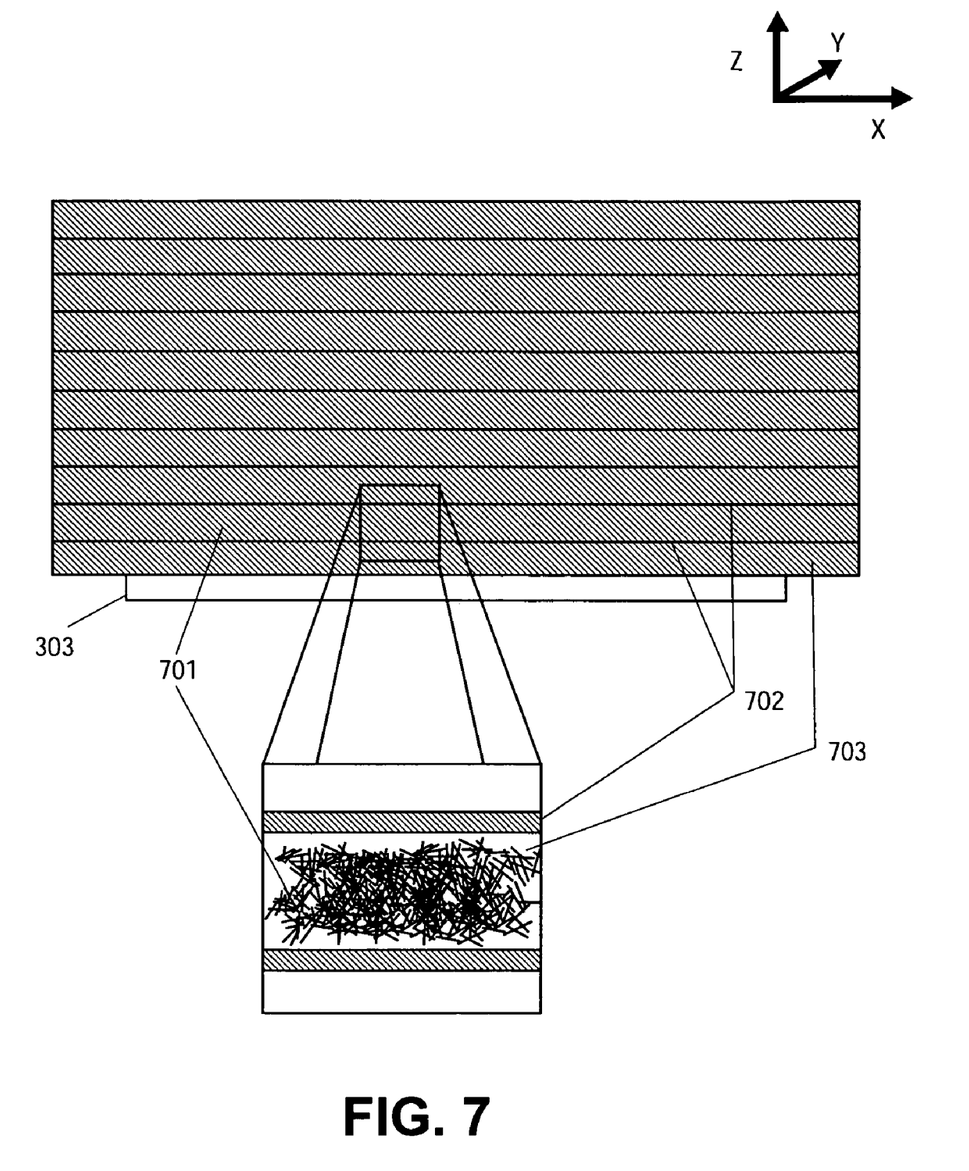
FIG. 7 shows an embodiment of a heat spreader using carbon fibers to spread heat in multiple dimensions that contains chopped fibers in between the horizontal fiber layers.

In this embodiment, shown in FIG. 7, the chopped fibers 701 are placed in between the woven sheets 702 that are oriented in the x-y plane, forming a layered structure. The chopped fiber 701 and the woven sheets 702 are then impregnated with a carbon or metal-based matrix material 703, to form a composite. The chopped fibers 701 may aid in increasing thermal conductivity in the z-axis, much like the oriented fibers discussed in previous embodiments. The use of chopped fibers 701 may allow the manufacture of a heat spreader with many of the advantages discussed above at a reduced cost. In a further embodiment, the woven sheets 702 may be eliminated all together, and chopped fibers 701 or other type of carbon material, such as carbon flakes, dispersed throughout the heat spreader may be used to facilitate conduction through the matrix.

Figure 8A:
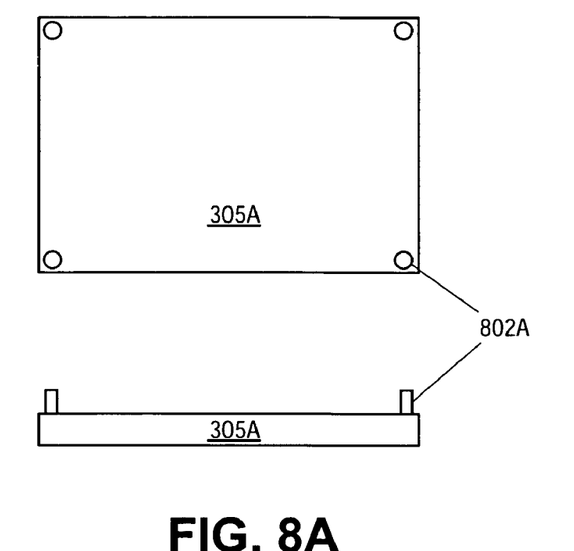
FIG. 8a shows top and side views of an embodiment of a heat spreader using carbon fibers to spread heat in multiple dimensions that has attached standoffs.
Figure 8B:
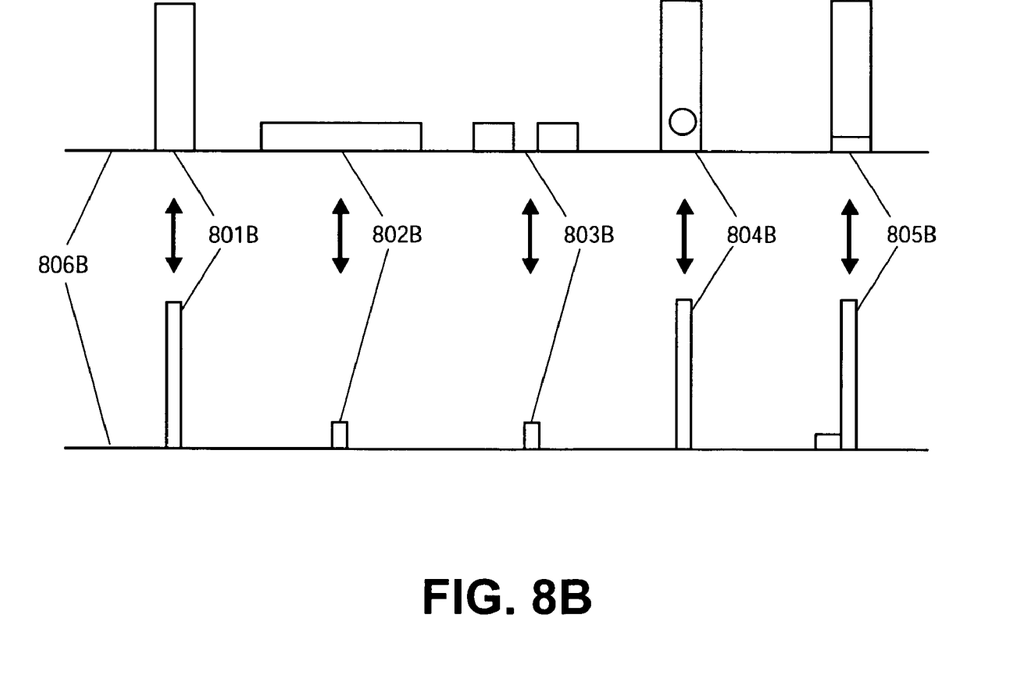

Recall from the discussion of FIG. 3 that the heat spreader 305 is attached to the substrate 301 using a sealant material 307. This allowed for a more flexible and lighter weight point of attachment between the two structures. Sometimes, however, a more rigid package may be desired. FIGS. 8a and 8b illustrate how a more rigid structure may be achieved with the present invention. In this embodiment, a plurality of legs 802a are added to the heat spreader 305a to serve as additional support and points of attachment when bonding the heat spreader 305a to the substrate (301 in FIG. 3.) In this illustration, four cylindrical legs are shown. It is to be understood that the number of legs, and their shape, may vary from application to application. Referring to FIG. 8b, other shapes may include, but are not limited to, rectangular legs 801b, contiguous walls 802b, non-contiguous walls 803b, rectangular legs with holes 804b or rectangular legs with feet 805b. The relationship of the substrate to these structures is shown by 806b. In an embodiment, the above structures are approximately 0.63 mm tall. It should be understood, however, that the height of these structures will vary with different applications, and that the above dimension should not be construed as limiting the size of the structures.

Referring again to FIG. 8A, the legs 802a may be constructed using a variety of materials and methods. In one embodiment, they are constructed of a polymeric material. One example of such as a material is a high modulus epoxy.

One method of manufacturing legs using high modulus epoxies would be injection molding. However, there are a multitude of other methods that may be used for forming the legs, depending on the material used. These include, but are not limited to: Machining, liquid resin molding and thermoforming.

The legs 802a may be attached to the heat spreader 305a through a bonding process. Examples of bonding types may include attachment with an adhesive, such as an epoxy, or soldering. Depending on the type of material used for the legs and the type of bonding process, it may be necessary to roughen the surface of the heat spreader at the point of attachment, to increase the strength of the foot/heat spreader bond. Although there are a multitude of methods that can be used, examples of techniques used for roughening may include mechanical means, or through laser marking.

Figure 9:
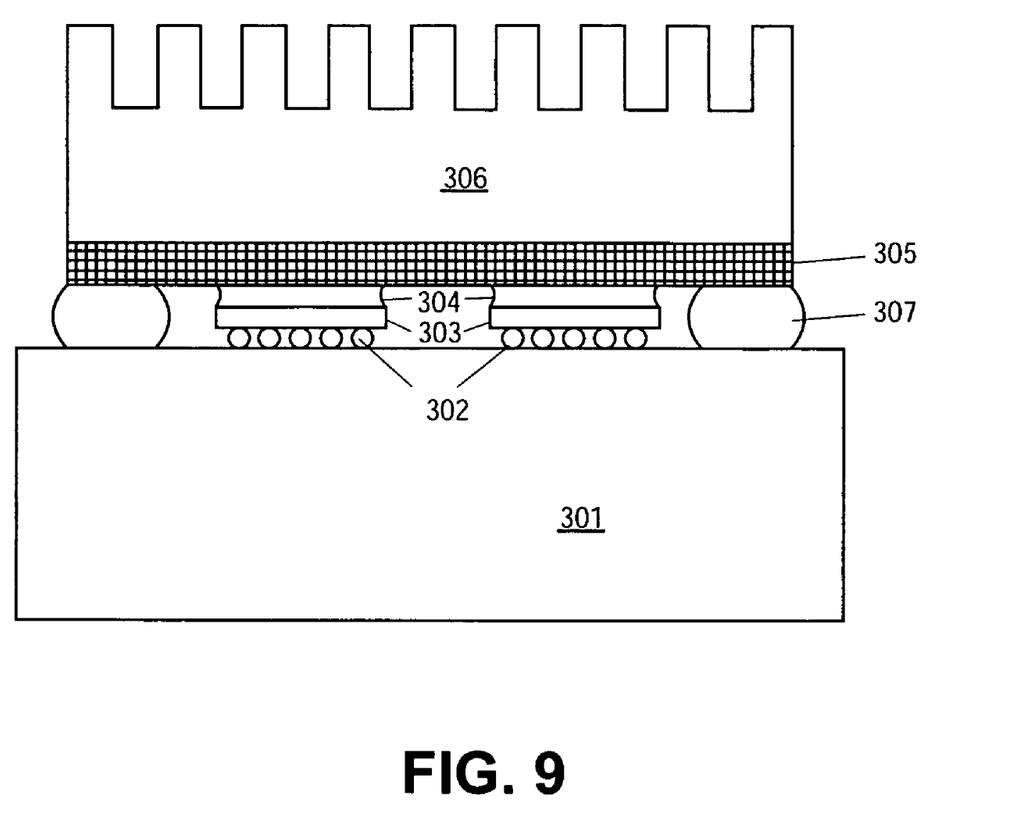
FIG. 9 shows an integrated circuit package, containing an embodiment of a heat spreader using carbon fibers to spread heat in multiple dimensions, which contains a plurality of integrated circuits.

While the previous embodiments have focused on flip chip packages containing a single device, the present invention could also be used for packaging substrates with multiple integrated circuit devices attached. As shown in FIG. 9, these packages would have a configuration similar to that of a single chip package, containing multiple devices 303 attached to the substrate 301 through ball-grid arrays 302 and thermally coupled to the carbon/carbon or metal/carbon heat spreader 305 using a compliant heat-transfer medium 304. The heat spreader 305 is coupled to the substrate using either a sealing material 307 or through a combination of sealing material and legs, as discussed in FIG. 8. The heat spreader will be further attached to a heat sink 306 to facilitate the removal of heat from the heat spreader 305. All of the aforementioned embodiments with regard to heat spreader construction may also apply to the multi-chip configuration.

Thus, what has been described is an apparatus for spreading heat removed from the backside of a packaged semiconductor device. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method of forming a heat spreader, comprising:
    placing a plurality of woven fibers having a first fiber density into a mold;
    placing a plurality of fibers having a second fiber density into the mold above the plurality of woven fibers having the first fiber density, the second fiber density being different than the first fiber density;
    placing a plurality of woven fibers having a third fiber density into the mold above the plurality of fibers having the second fiber density, the third fiber density being different than the second fiber density;
    disposing a heat conductive material around the plurality of woven fibers having the first fiber density, the plurality of fibers having the second fiber density, and the plurality of woven fibers having the third fiber density; and
    curing the heat conductive material.

2. The method of claim 1, wherein disposing the heat conductive material comprises compression molding.

3. The method of claim 1, wherein disposing the heat conductive material comprises injection molding.

4. The method of claim 1, further comprising cutting the heat conductive material, the plurality of woven fibers having the first density, the plurality of fibers having the second density, and the plurality of fibers having the third density to form the heat spreader.

5. The method of claim 1, wherein the first fiber density and the third fiber density each have a higher fiber density than the second fiber density.

6. The method of claim 1, wherein the first fiber density and the third fiber density each have a fiber density four times greater than the second fiber density.

* * * * *